United States Patent [19]
Hill et al.

[11] Patent Number: 5,129,006
[45] Date of Patent: Jul. 7, 1992

[54] ELECTRONIC AUDIO SIGNAL AMPLIFIER AND LOUDSPEAKER SYSTEM

[76] Inventors: Amel L. Hill, 2837 Summerbrooke Way, Casselberry, Fla. 32707; John F. Goad, 2933 E. Floral Way, Apoqka, Fla. 37703; Barry Goldfarb, c/o C.W.P. Enterprises, Inc., 1108 W. Euclid Ave., DeLand, Fla. 32720

[21] Appl. No.: 294,446

[22] Filed: Jan. 6, 1989
(Under 37 CFR 1.47)

[51] Int. Cl.[5] .............................................. H03G 5/00
[52] U.S. Cl. ..................................................... 381/100
[58] Field of Search ............................ 381/100, 24, 28

[56] References Cited

U.S. PATENT DOCUMENTS

| | | | |
|---|---|---|---|
| 3,872,247 | 3/1975 | Saville et al. | 381/121 |
| 3,922,641 | 11/1975 | Gates, Jr. | 381/81 |
| 4,346,349 | 8/1982 | Yokoyama. | |
| 4,408,095 | 10/1983 | Ariga et al. | 381/27 |
| 4,441,086 | 4/1984 | Karlow et al. | |
| 4,455,535 | 6/1984 | Sugawara. | |
| 4,482,866 | 11/1984 | Crooks. | |
| 4,589,135 | 5/1986 | Baker | 381/100 |
| 4,638,258 | 1/1987 | Crooks. | |
| 4,646,349 | 2/1987 | Puls. | |
| 4,763,012 | 9/1988 | Blankinship | 381/123 |
| 4,771,466 | 9/1988 | Modafferi | 381/100 |
| 4,841,573 | 6/1989 | Fujita | 381/27 |

*Primary Examiner*—Forester W. Isen
*Attorney, Agent, or Firm*—Banner, Birch, McKie & Beckett

[57] ABSTRACT

An electronic audio signal amplifier and loudspeaker system comprises a preamplifier circuit, a plurality of L electronic crossover networks, a plurality of M output amplifiers and an associated plurality of M loudspeaker assemblies. The electronic crossover networks conjugate an input signal into at least low, mid and high frequency bands which do not overlap for broadcast form at least three loudspeaker assemblies particularly designed for such broadcast and for alleviation of intermodulation distortion. The system delivers an omnidirectional sound at equivalent acoustic energy to listeners over the entire audible spectrum with limited intermodulation distortion. A center channel loudspeaker assembly of the system comprises first and second ported chambers, the second chamber being filled with a sound-absorbent material to attenuate acoustic energy at certain frequencies broadcast from a woofer of the assembly.

14 Claims, 8 Drawing Sheets

ELECTRONIC AUDIO SIGNAL AMPLIFIER AND LOUDSPEAKER SYSTEM

This application is related by subject matter to commonly assigned, copending and concurrently filed U.S. Applications bearing Ser. Nos. 294,364, 294,365, and 294,366.

BACKGROUND OF THE INVENTION

1. Technical Field

The invention relates to the field of electronic audio signal amplifier and loudspeaker system design and, more particularly, to an electronic audio signal amplifier and loudspeaker system capable of omni-directional sound enjoyment and low intermodulation distortion.

2. Description of the Relevant Art

Electronic audio signal amplifier systems are typically designed for delivering maximum power to an electrical load, namely a loudspeaker. In the design of such a system, there is no particular attention paid to the delivery of acoustic energy to a human listener and, more particularly, to how that human listener perceives the delivered acoustic energy representative of an originally recorded audio sound.

To the contrary, it is typical to design an electronic audio signal amplifier system separately from the design of a loudspeaker system. Design is accomplished from a component approach such that one component is individually designed without particular regard to the specific design of another component which is coupled to it. Rather each component is designed separately to interface with a presumed component design. The result of this design approach may be, for example, the connection of a high power amplification system to a loudspeaker system which is not capable of handling the high power audio output signal levels. When the gain of the amplifier system is turned up, loudspeakers of the loudspeaker system may be irreparably damaged.

The perceptive capability of the human ear to receive sound energy has been scientifically analyzed by audiologists. It has been determined that the capabilities of men and women for perceiving sounds at different frequencies differ. Men, for example, are capable of listening to low frequency acoustic audio signals better than women, that is, in a frequency range beginning at approximately 20 Hz. On the other hand, women have an appreciably better ear for high frequency acoustic audio signals up to approximately 20 KHz. Furthermore, on the average, both men and women are able to hear and so appreciate low frequency acoustic energy better than high frequency acoustic energy. Also, the intelligible quality of acoustic energy which permits a listener to differentiate a violin, for example, from a cello relates to the low to mid range frequency response characteristics of the original sound which is that response region in which both men and women perceive sounds almost equally. Yet, the design of audio signal amplification systems including loudspeakers for acoustic energy transmission has for the most part ignored any system design perspective from audio electrical signal source to the human listener's ear.

Also prior art electronic audio signal amplifier systems, especially stereophonic systems, have evolved from the concept of intentionally building a soundstage from which direction acoustic energy emanates to a listener. Once a soundstage is built of speakers placed at particular locations or positions in a typical room, listeners also must carefully position themselves at a location to properly appreciate, for example, a left channel of directional stereophonic sound from a right channel of directional stereophonic sound.

Stereophonic loudspeaker assemblies are typically directional, i.e., they intentionally direct a sound toward an assumed listener position. Furthermore, the assemblies for stereophonic loudspeakers often comprise plural tweeters, woofers and subwoofers each of which may receive a full audio range of frequencies at its input such that there is a capability for intermodulation distortion from providing too great a frequency range and so an overlapping frequency range to each speaker type. To alleviate this problem, loudspeaker manufacturers or manufacturers of loudspeaker assemblies include passive crossover networks within the loudspeaker or assembly enclosure to separate frequency bands to a limited extent. Nevertheless, acoustic energy broadcast from one speaker type intermodulates with acoustic energy from another and creates intermodulation distortion because, even in systems including passive crossover networks, frequency bands overlap considerably. Furthermore, at least two such assemblies are provided for left and right channels of stereophonic sound and their respective acoustic energy outputs intermodulate and creat distortion.

As already briefly described, some loudspeaker drive assemblies, for example, coaxially mounted tweeter and woofer assemblies comprise first order passive filtering means for separating frequency bands for the tweeter while the woofer receives a full range of frequencies. The frequency bands still overlap considerably and create intermodulation distortion.

A speaker balance control is often provided to alleviate the requirement that a listener be precisely located at one particular position in a room. For example, if a listener is located close to a left channel loudspeaker than to a right channel loudspeaker, the listener may adjust a balance control to decrease the amount of amplification of the left channel and to increase the amount of amplification of the right channel so that the listener perceives the left and right channels equally. However, the listener who adjusts the left and right channel balance from a central balance switch position may not have any appreciation for the original balance of the audio signal recording or source. Consequently, the listener will probably adjust the balance inaccurately. Furthermore, once adjusted for the one listener location, another listener located elsewhere will perceive the sound differently and will also not be listening to the originally recorded signal or the signal originally generated at a source.

Also a treble/bass control or other complex equalization system is often provided to overcome the effects of unequal acoustic output over the audible frequency range from loudspeaker assemblies. Such equalization settings are controlled by a user who may not know the originally recorded audio sound and have little or no ability to correct the perceived frequency response.

Through the development of electronic audio signal amplifier and speaker systems for automobiles and other close environments, listeners have begun to appreciate the desirability of what may be considered a more omni-directional sound system in which the sound surrounds the listener. The more advanced of these systems may be quadrophonic and comprise speakers for four sound channels and an individually powered subwoofer speaker having its own output amplifier providing a fifth sound channel for bass frequencies. In such systems, a single crossover network may be applied for frequency division and limited audio channel delivery. The crossover network generally comprises a passive resistive and capacitive filter network for separating the subwoofer band of interest without particular regard to the sharpness of filter response. In fact, generally, the several speakers besides the subwoofer are intentionally vibrated over their entire frequency range and generate considerably intermodulation distortion via overlapping frequency bands of interest with other provided speakers.

Intermodulation distortion relates to an electrical phenomenon whereby electrical signals at one frequency interfere with and create undesirable modulation products with another desired and different frequency. The modulation products amount to noise and undesirably distort the original audio signal. Intermodulation distortion is a measurement in percent by which the high frequency energy at one frequency is modulated by the electrical signals at a second frequency. Intermodulation distortion is exacerbated in an electronic amplifier system through stages of amplification. For example, intermodulation distortion noise created in a first amplifier is amplified by a second stage of amplification and so creates additional undesirable modulation products with other desired frequencies at the second stage. A discussion of intermodulation distortion in amplifier systems is found, for example, in Transmission Systems for Communication, published by Bell Telephone Laboratories, 1970, at pages 320-331.

Another phenomenon uncovered through more recent inventigations at Bell Telephone Laboratories has been identified as transmodulation distortion. In theory, transmodulation distortion noise is created above intermodulation noise products and represents frequency modulation products of different phase and harmonics.

In a loudspeaker assembly, intermodulation distortion is further created, for example, in the translation of electrical energy to acoustic energy and may be experienced as an excessive, undesirable vibration of the loudspeaker assembly. For known loudspeaker assemblies and depending on the degree of utilization of the possible frequency pass characteristic for an included loudspeaker, intermodulation distortion may be in the range of ten to twenty percent. Despite the intermodulation distortion, such loudspeaker assemblies may still demonstrate a relatively flat frequency response over the band of interest. As indicated above, intermodulation distortion is related to undesirable mechanical vibration translated to a loudspeaker enclosed by the enclosure, to driving a particular loudspeaker type over too broad a frequency range as well as to other causes. A brief discussion of the theory of intermodulation distortion as applied to the design of loudspeaker assemblies is found in an appendix to U.S. application Ser. No. 294,364, concurrently filed herewith.

Consequently, despite the closed environment of an automobile, known automobile loudspeaker systems still tend to exhibit a considerable amount of both directionality and intermodulation distortion. When the driver adjusts volume and balance controls for front and rear speakers and for left and right channels so that the driver is please with the perceived sound, a front or rear seat passenger may not only be displease with the perceived acoustic energy but may not be positioned in a similar situation to the driver of the automobile for appreciating the originally recorded audio signals.

Consequently, there exists a requirement in the art for providing an electronic audio amplifier and speaker system which has similar effect to listeners, no matter where they may be located in a room or other closed compartment. Acoustic energy perceived by the listener across the entire audio frequency range must be equal no matter where the listener locates themselves in relation to the speakers. The listener should not necessarily be able to determine from which speaker a particular sound originates. From a different perspective, there remains a requirement in such a system to permit as many loudspeakers as possible to be located anywhere in a listening environment or at any height level without particular regard to a requirement for building a sound stage. Furthermore, there exists a requirement in the art for reducing the effects of intermodulation distortion and the creation of undesirable modulation products and so limit the potential for appreciating the originally recorded sound.

SUMMARY OF THE INVENTION

It is an object of the present invention to produce a perceived delivery of a full frequency range of audio signal acoustic energy to a listener which is true to the originally recorded sound.

It is a further object of the present invention to deliver a full frequency range of audio signal acoustic energy to a listener without intermodulation distortion.

It is a still further object of the present invention to deliver a full frequency range of audio signal acoustic energy that is substantially omni-directional and without particular regard to listener or loudspeaker location or position.

It is a still further object of the present invention to design an electronic audio signal amplifier and loudspeaker system from a system perspective in which a recorded or other original audio signal at a source is delivered via the present invention to a listener where it is perceived and enjoyed.

These and other identified objects are accomplished in accordance with principles surrounding the design of the present amplifier and loudspeaker system whereby, in the electronic amplifier, a plurality of electronic crossover networks are individually employed to conjugate and separate an input audio signal into a plurality of different bands of component frequencies. Whenever possible, these bands do not overlap and the electronic crossover networks provide sharp cutoffs and attenuation outside the bands of interest. For example, the bands may comprise a very low frequency band of 17.5-150 Hz, a mid range band of 150-6 KHz, a center frequency band 150-20 KHz and a high frequency band above 6 KHz. To achieve sharp cutoffs, the electronic crossover network comprises an active fourth order filter comprising four operational amplifiers from which circuit both a high pass and a low pass function may be derived.

In a stereophonic system, two electronic crossover networks separately conjugate a left and a right stereophonic channel input at very low and midrange frequencies, i.e., 150-6 KHz, a range of audio frequencies over which range the human listener intelligibly differentiates perceived sounds. Intermodulation distortion is minimized upon deliver to left and right channel midrange loudspeaker assemblies according to the present invention. On the other hand, additional loudspeaker assemblies are separately provided for each conjugated band. From the large plurality of such loudspeaker assemblies, any directionality of left and right channel broadcase is de-emphasized. Quadraphonic inputs may be similarly conjugated by two additional electronic crossover networks and provided to two additional midrange loudspeaker assemblies without any marked increase in intermodulation distortion.

Also, it is a principle of the present invention to properly match output amplifiers and loudspeakers and so closely control the level of power delivered to the loudspeaker. This principle is related to the delivery of equivalent power across the audible frequency range in accordance with FIG. 10 which will be discussed in detail herein.

While both a preampliciation stage and an output amplification stage are provided in the amplifier circuitry according to the present invention, the creation of intermodulation distortion between stages of amplification is alleviated via the electronic crossover networks which separate the two stages of amplification. This is accomplished by providing a sharp cutoff in frequency response in each electronic crossover network to define the band or bands of interest for each network. For example, each electronic crossover network may comprise a fourth order active bandpass filter having a 24 db per octave response outside the pass band. Consequently, only desired bands of interest are combined and provided to respective output amplifiers. Any modulation products created in a preamplifier outside the passband functions of the crossover networks are stopped and prevented from reaching the output amplifier stage. One output amplifier is respectively coupled to one predetermined loudspeaker assembly designed for providing an acoustic output related to the electric input signals provided via the electronic crossover networks and the corresponding output amplifier. For example, a subwoofer speaker assembly may receive an input electrical signal having a limited passband of 17.5-150 Hz. This limited passband has resulted from the amplification of the output of electric crossover networks for passing only the band of interest between 17.5 and 180 Hz. More importantly, the limited passband tends to minimize the opportunity for the creation of intermodulation distortion at the subwoofer loudspeaker assembly.

According to the present invention, the output amplifier circuit comprises an operational amplifier for driving a balanced power amplifier capable of operation in either a Class A or B mode depending on supplied power or Class AB. The balanced power amplifier comprises a pair of Darlington transistors. The balanced circuit design alleviates noise and delivers a balanced signal to a driven loudspeaker of a loudspeaker assembly according to FIG. 5-8.

Figure 5:
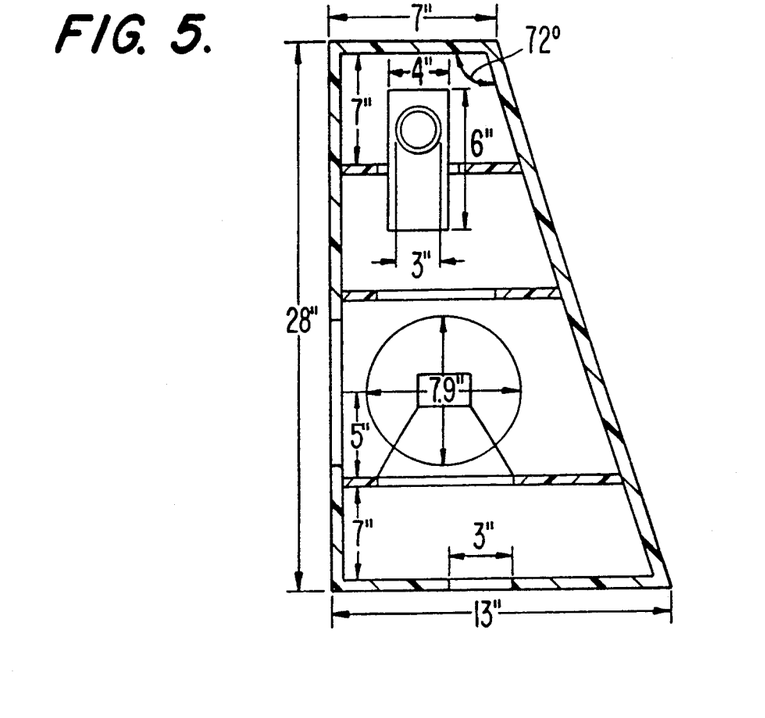
FIG. 5 is an assembly drawing in cross-section of a sub-woofer loudspeaker assembly for broadcasting acoustic energy at very low audio frequencies.
Figure 7:
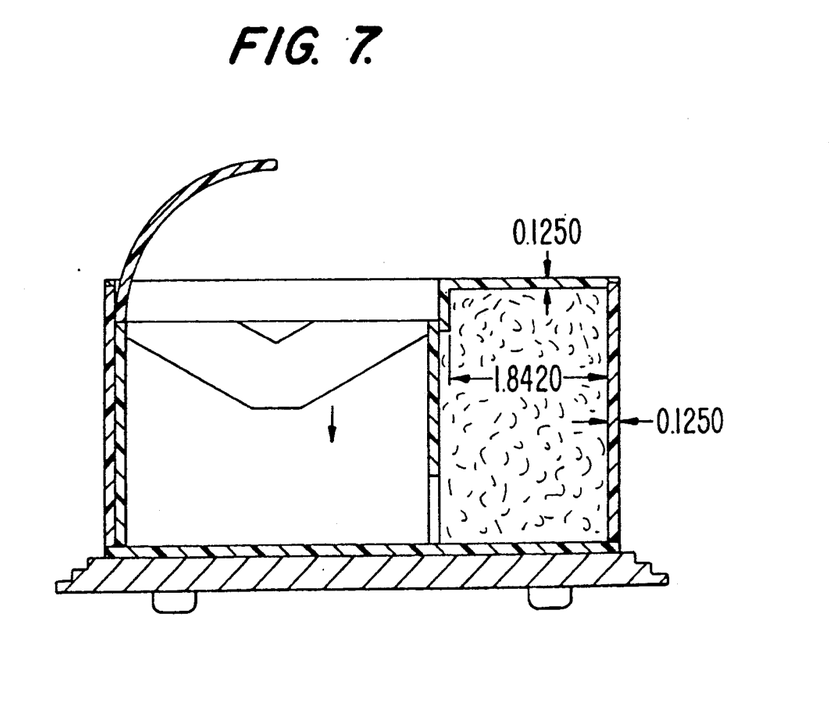
FIG. 7 is an assembly drawing in cross-section of a center channel loudspeaker assembly for radiating acoustic energy at a center band of audio frequencies.
Figure 8:
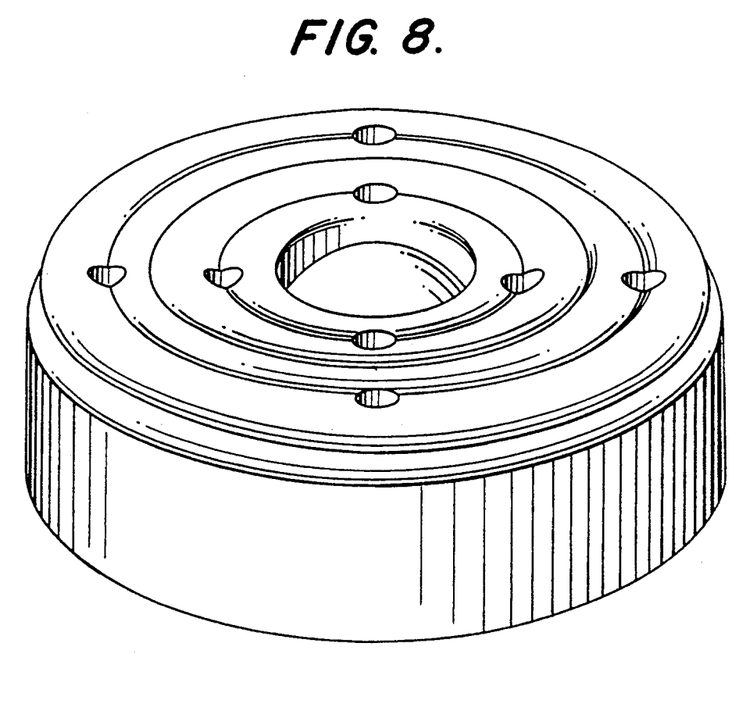
FIG. 8 is an assembly drawing in cross-section of a tweeter loudspeaker assembly for radiating acoustic energy at very high audio frequencies.

The design of loudspeaker assemblies according to the present invention also takes into consideration the elimination of intermodulation distortion within the loudspeaker assembly itself. The elimination of intermodulation distortion is particular loudspeaker assemblies operating at particular frequencies is described in further detail in copending and concurrently file U.S. patent applications Ser. Nos. 294,365, 294,364, and 294,366, by Amel Lee Hill, entitled "Sub-Woofer Loudspeaker Assembly", "Improved Midrange Loudspeaker Assembly", to which invention John F. Goad also contributed, and "Tweeter Loudspeaker Assembly", respectively, which are incorporated herein by reference, and are shown in FIGS. 5, 6 and 8 of the present application. A center channel loudspeaker assembly according to FIG. 7 is described in some detail in the following detailed description of the invention. By way of example, however, the effects of vibration in creating intermodulation distortion in a loudspeaker assembly are minimized to a great extent in both a subwoofer and a midrange loudspeaker assembly design by utilizing the front and back acoustic waves from a loudspeaker enclosed in the assembly to cancel vibrations translated to the respective enclosure.

BRIEF DESCRIPTION OF THE DRAWINGS

FIGS. 5-8 are assembly diagrams of exemplary loudspeaker assemblies for application as loudspeaker 1-M of FIG. 1.

In particular.

DETAILED DESCRIPTION

Figure 1:
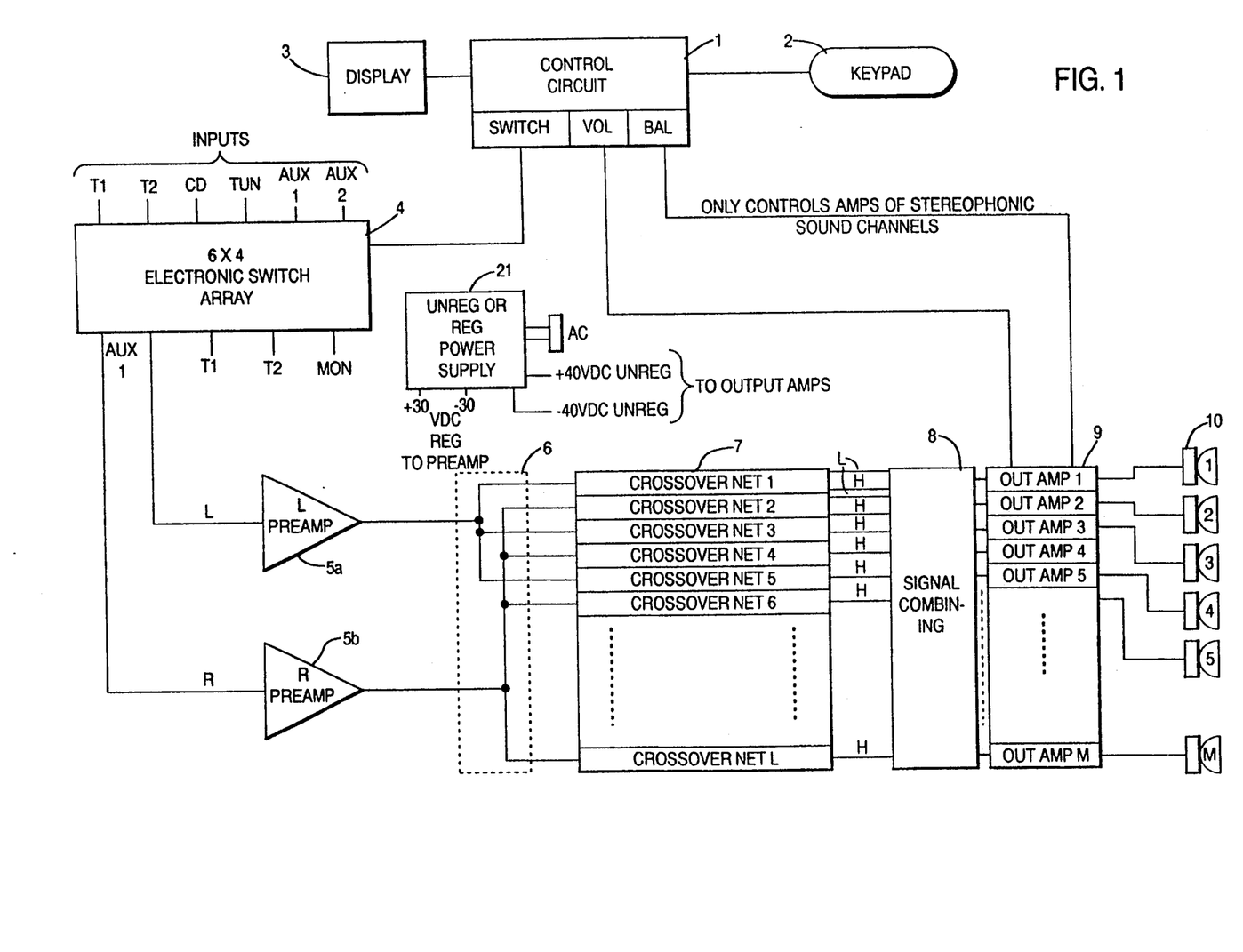
FIG. 1 is a detailed schematic block diagram of an electronic audio signal amplifier and loudspeaker system according to the present invention.

Referring to FIG. 1, there is shown a block schematic diagram of an electronic audio signal amplifier and loudspeaker system in accordance with the present invention. A control circuit 1 which may be a logic circuit array or processor unit comprises at least three modes of control and interfaces with a visual or other display 3 and a keypad or other input device 2 which may be a remote control device. A first mode of control relates to switch control for controlling an electronic switch array 4.

The depicted electronic switch array 4 is 6×4 for connecting at least one of six inputs to at least one of four outputs. However, the array may be appropriately sized by one of ordinary skill in the art to the number of particular inputs and outputs provided. For example, and as shown, the inputs may represent first and second tape recorders T1 and T2, a compact disc player CD, an AM/FM tuner TUN and auxiliary ports AUX 1 and AUX 2. On the output side, the outputs comprise first auxiliary stereophonic port AUX 1, the tape recorders T1 and T2 and a monitor jack MON. The electronic switch array, for example, may connect input CD to output AUX 1 for listening to a compact disc played on disc player CD. Simultaneously, the output jack MON may be selectably and switchably connected for monitoring the transmitted compact disc player output signal. Simultaneously, under control of control circuit 1 in a switch mode of control, a second input signal, for example, a tape played at tape recorder T1 may be recorded by connection to tape recorder output T2. Also, output monitor jack MON may be selectably and switchably connected to the tape recorded output signal if desired. Display 3 may display the present status of connected inputs and outputs as desired. For example, a flashing light emitting diode LED may indicate a source and a constantly lit diode, the switched destination of the source. If the number of simultaneously switched states is greater than two, the display 3 may comprise a network map particularly identifying connection status.

In a mode of control related to audio volume adjustment, a user inputs, for example, a key depression for actuating a continuous stepped increase in volume control output of output amplifiers 9. Display 3 may be a bar type display of volume output for each stereophonic channel or may be a numerical indication of output signal amplitude.

In a mode of control related to left and right channel balance in a stereophonic system, a user may actuate a key for decreasing or increasing left channel amplification in relation to right channel amplification from a central balance position. Display 3 if implemented in the form of a bar type display will indicate the relative degree of balance adjustment provided or an alternate balance indication may be displayed. As will be described further herein, the channel balance only relates to two of M output amplifiers for providing a 150 Hz-6 KHz midrange frequency output signal to individual midrange loudspeaker assemblies for acoustic broadcast of left and right stereophonic speaker channels.

Conspicuously absent from the present invention is any means of equalization or treble/bass control as the system is designed to provide omnidirectional sound. The frequency response perceived by any listener at any location is designed to be smooth over the entire human ear response.

The electronic amplifier system according to the present invention comprises preamplifier circuits 5a and 5b for preamplification of a selected left and right channel input signal respectively fed via output port AUX 1. The number of leads of output port AUX 1 would necessarily increase in a quadraphonic or other multi-channel embodiment as would the number of preamplifiers increase depending on the number of individual channels (not shown).

The outputs of left channel preamplifier 5a and right channel preamplifier 5b are provided via coupling circuit 6 to crossover networks 7. Of crossover networks 7, L separate networks are provided, 1-L, depending on the intended use of loudspeaker assemblies 10 and output amplifiers 9 which correspond and are numbered 1 ... M.

Electronic crossover networks 1 ... L are individually designed to conjugate at least one particular pass band from its input signal. At least first and second crossover networks may provide both a low and high pass band output L and H respectively and in phase for driving a subwoofer loudspeaker assembly and stereophonic midrange loudspeaker assemblies for the left and right channels according to FIGS. 5 and 6, respectively. As will be subsequently described herein in relation to FIG. 3, the present electronic crossover network comprises a fourth order active filter from which filter both a low and a highpass function may be derived with sharp cutoffs in the stopped band.

Signal combining circuit 8 couples and combines the several output signals of the crossover networks 7 with the M output amplifiers 9. In a stereophonic sound system according to the present invention for achieving omnidirectional audio appreciation, the left and right channel outputs of at least two crossover networks 7 having a particular passband are added together at signal combining circuit 8 so that the output signal more closely matches the passband of interest of an associated output amplifier 9 and particular loudspeaker assembly 10.

For example, the fifth and sixth crossover networks may be provided for filtering the left and right preamplifier output signals respectively as shown. Each network 5 or 6 will be tuned to pass 6 signals above 6 KHz and sharply attenuate all signals below the pass band. The output signals of the fifth and sixth networks 7 are combined at signal combining circuit 8 and provided to a fourth output amplifier 9 for driving a tweeter loudspeaker assembly 10 according to FIG. 5.

Additional crossover networks 7-L are provided, for example, in the event that a quadraphonic or other multichannel input signal is provided or for conjugating different frequency bands for eventual broadcast by particularly designed speaker assemblies. For example, a center channel loudspeaker assembly according to FIG. 7 may be considered too broad a range of frequencies. Frequency bands overlap frequencies of the midrange speaker and so may be undesirable. Consequently, a center channel frequency loudspeaker assembly may be particularly designed for a high center band and a low center band, i.e., 6 KHz-12 KHz and 12 KHz to 15 KHz. The tweeter loudspeaker assembly then may be redesigned to broadcast only 15 KHz-30 KHz audible frequencies with a corresponding decrease in overall intermodulation distortion. In other words, electronic crossover networks may be applied for conjugating and dividing out four or more non-overlapping bands of interest of the audible sound spectrum.

Figure 4:
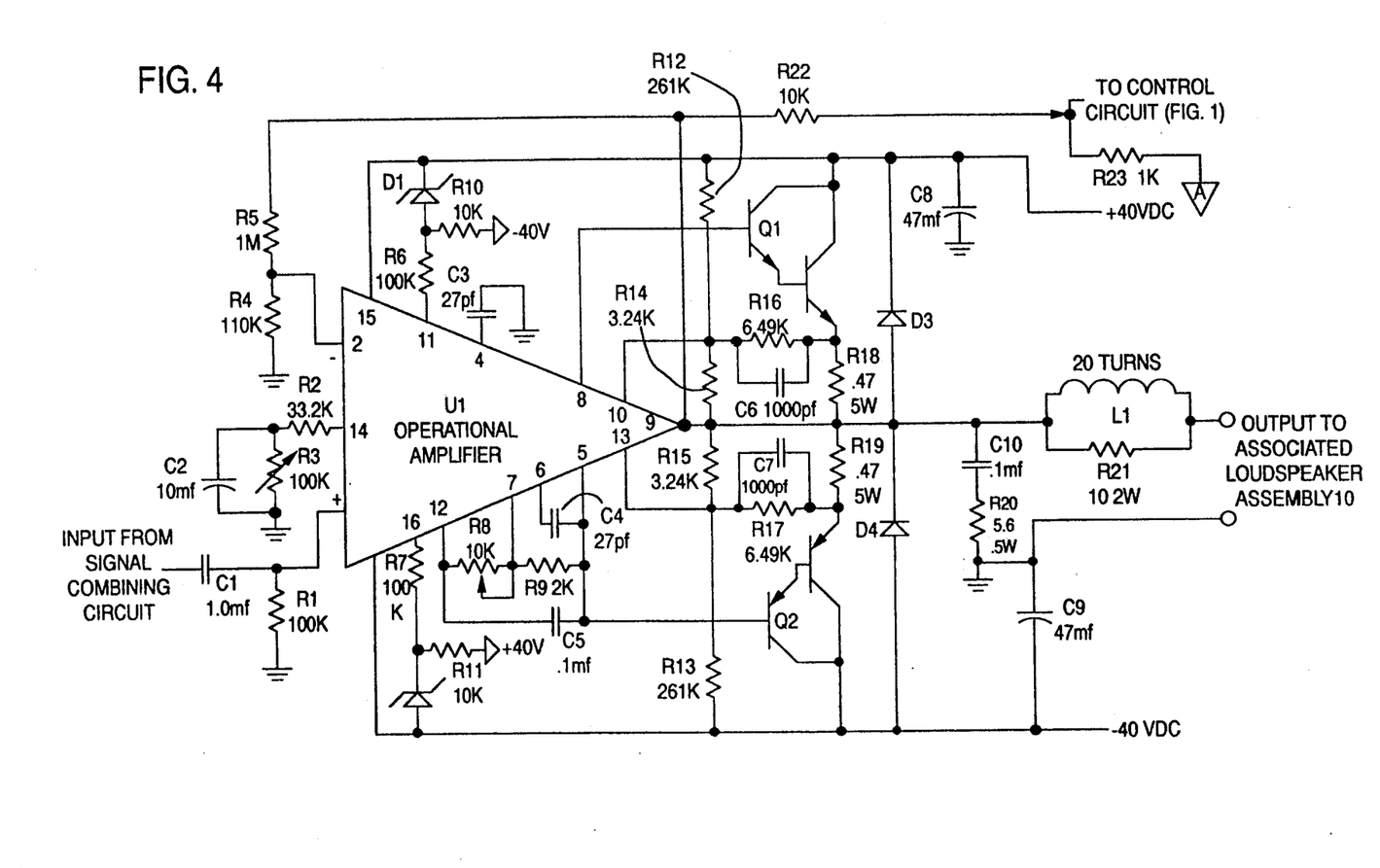
FIG. 4 is a detailed schematic diagram of an exemplary output amplifier circuit for application as output amplifiers 1-M of FIG. 1.

Each of M output amplifier circuits 9 is identically designed and are particularly shown in reference to FIG. 4. Output amplifier circuits 1-M are each equipped with a balanced Darlington output amplifier circuit and are so characterized for noise reduction and improved intermodulation distortion as will be herein explained. Furthermore, it comprises an operational amplifier input stage for providing a signal to the balanced Darlington output stage capable of either class A or B operation, depending on the applied power level. Further, the output amplifier may be capable of class AB operation. A first and a second output amplifier may be associated with two midrange loudspeaker assemblies, for example, in accordance with FIG. 6 for amplifying the left and right channel higher frequency output signals H respectively of the first and second crossover networks 7. Such an association exemplifies the feature of the present invention of providing crossover network frequency characteristics which in turn properly match the characteristic band of interest of a particular type of loudspeaker assembly. Also the experience of any directionality from left and right stereophonic channels is de-emphasized by providing only two midrange speaker assemblies of a total of five.

To arrive at an omnidirectional sound experience and in keeping with the perception experience of male and female listeners, the high frequencies are de-emphasized by only providing a fourth tweeter loudspeaker assembly 10 comprising just one tweeter loudspeaker according to FIG. 8. On the other hand, the low frequency signals are emphasized in that the subwoofer loudspeaker assembly according to FIG. 5 comprises three loudspeakers in a particular design arrangement for delivering a relatively high acoustic energy output.

The loudspeaker assemblies are designed in such a way that they may be located practically anywhere in a room at any height level. Nevertheless, the subwoofer loudspeaker assembly according to FIG. 5 is designed to be located to face one corner of a room. Also, the two midrange loudspeaker assemblies for emanating signals representative of a left and right input channel respectively should be separated from one another, for example, to opposite sides of a room. The tweeter assembly may be set anywhere in a listening room but is best located at the center of a room mounted flush in the ceiling. Because of the relatively small size of each assembly, the collection of five of more loudspeaker assemblies do not tend to intrude upon the interior design of a listening room or upon the furniture layout within the room.

Power supply 11 of FIG. 1 provides power to components requiring power. For example, power supply 11 may provide unregulated power at + or −40 VDC to units requiring the same, for example, the output amplifier. On the other hand, the preamplifier circuits 5a and 5b require regulated power and so power supply 11 additionally comprises means for regulating the unregulated 40 VDC power. Further, the regulated power is divided down to + or −30 VDC for operation of the preamplifiers.

THE SYSTEM CONCEPT

Figure 10:
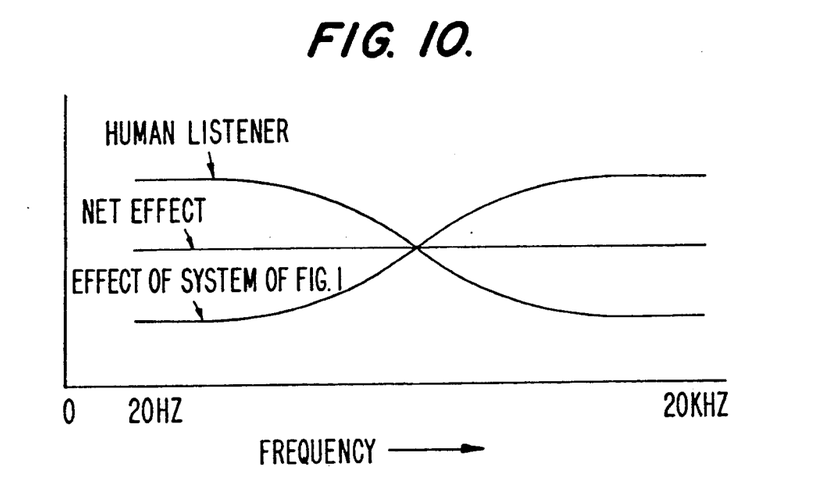
FIG. 10 is a graph showing frequency response characteristics for a human listener for the amplifier and loudspeaker arrangement according to the present invention and for the net effect of the arrangement.

Referring now to FIG. 10, the concept behind the development of the system of FIG. 1 will be discussed in some detail. A human listener is first able to detect sound at approximately 20 Hz; however, a high amplitude of sound is required for perception. The curve demonstrates an increase in perception by the human listener, requiring less amplitude for perception, as frequencies increase. At 20 KHz or slightly lower frequencies, the human listener is unable to perceive even the highest amplitudes.

In the present invention, the system design concept takes into consideration the different design characteristics of different loudspeakers, for example, as to mass, broadcast capability, and reactive load (impedance) so as to deliver net equivalent acoustic energy to the listener over the entire audible spectrum. To accomplish this objective, individual output amplifiers 9 are provided for each loudspeaker assembly 10 and active electronic crossover networks 7 are provided to match the frequency band of interest of each associated set of output amplifier and loudspeaker assembly.

The net result of the electronics of the present invention is to provide an acoustic energy frequency response curve which compensates for the human perceptive experience and provides a smooth net result characteristic. Furthermore, by providing a balanced output amplifier, by separating the output amplifier stage from the preamplifier stage, by conjugating out frequency bands of interest from the input signal and by providing loudspeaker assemblies particular designed for the conjugated frequency bands and to limit mechanically or acoustically created intermodulation distortion, the overall effects of intermodulation distortion which can be created anywhere in the system are minimized.

PREAMPLIFIER

Figure 2:
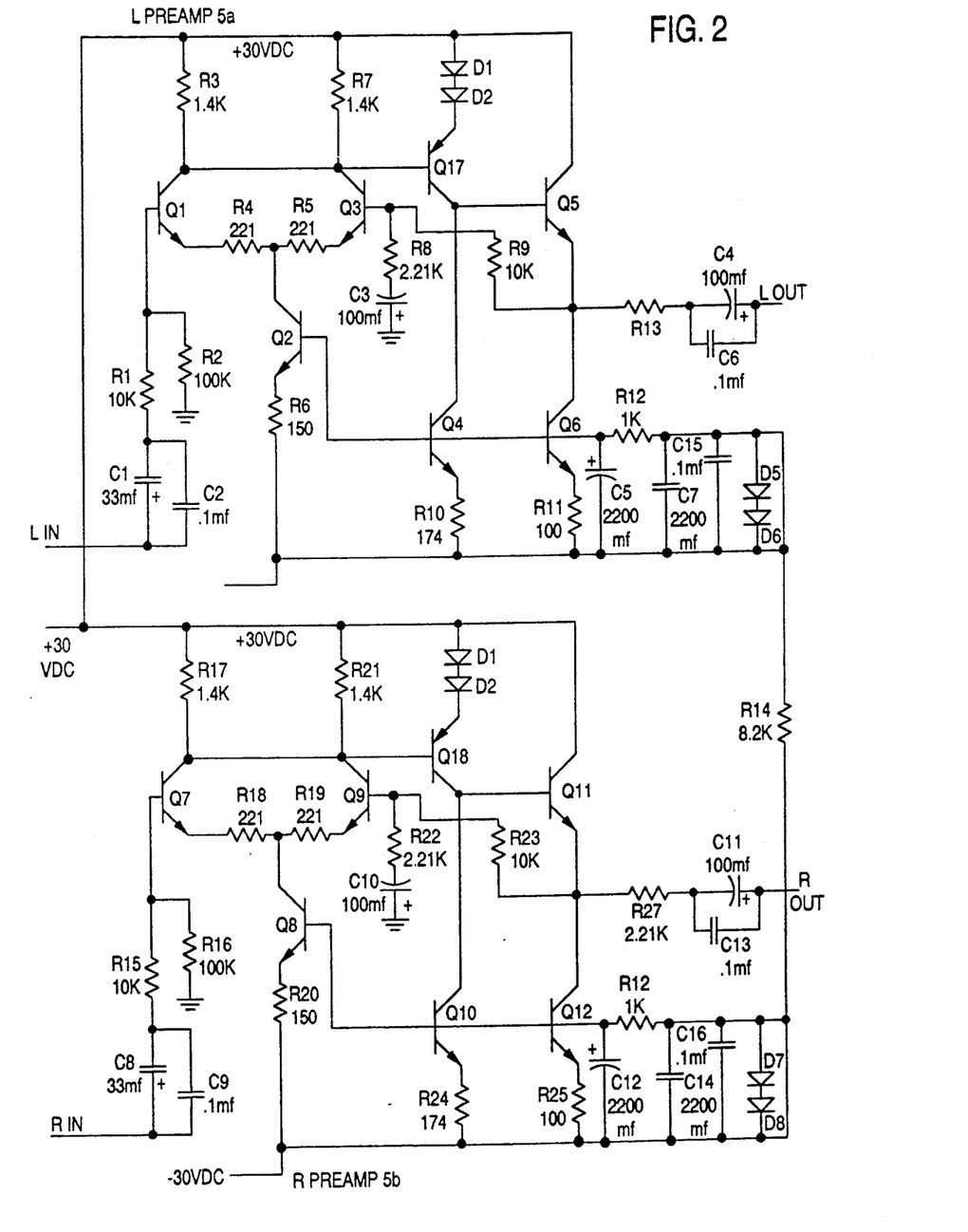
FIG. 2 is a detailed schematic diagram of an exemplary preamplifier circuit for application as left and right channel preamplifiers of FIG. 1.

Referring now to FIG. 2, the preamplifiers 5a and 5b of FIG. 1 will be explained in some detail. Each preamplifier is designed to amplify respective left and right channel input signals identically with approximately 20 dB of voltage gain. Each is a differential amplifier design. The input signal is provided to differential gain stages comprising transistor amplifiers Q1–Q14 which may comprise Motorola NPN MPS 8099 transistors. Transistors Q17–Q20 and and 22 comprise Motorola PNP transistors MPS 8599. Resistor and capacitor values are exemplary for the present design. An input filter stage comprising resistors R1, R2, C1, C2 and R15, R16, C8, C9 respectively tune the input to the audio passband of interest. Identical output R-C filter sections are provided in each amplifier for similar effect. The output stages of each preamplifier are coupled via a resistor R14 and respective output stage networks to assure identical floating treatment of the separate input signals.

ELECTRONIC CROSSOVER NETWORK

In the present high performance amplification and loudspeaker system the individual loudspeaker drivers (subwoofer, mid-range and tweeter) are each driven by an individual output power amplifier. The high, mid and low frequencies are separated from each other by the provision of electronic crossover networks. In a bi-amplified system, there are normally two power amplifiers (two preamplifiers in the present system) for the low, mid and high frequencies. Quad systems have four, and so on. The advantages of providing plural electronic crossover networks are many, including a resulting decrease in intermodulation distortion, an improved loudspeaker damping and a more precise crossover performance.

Figure 3:
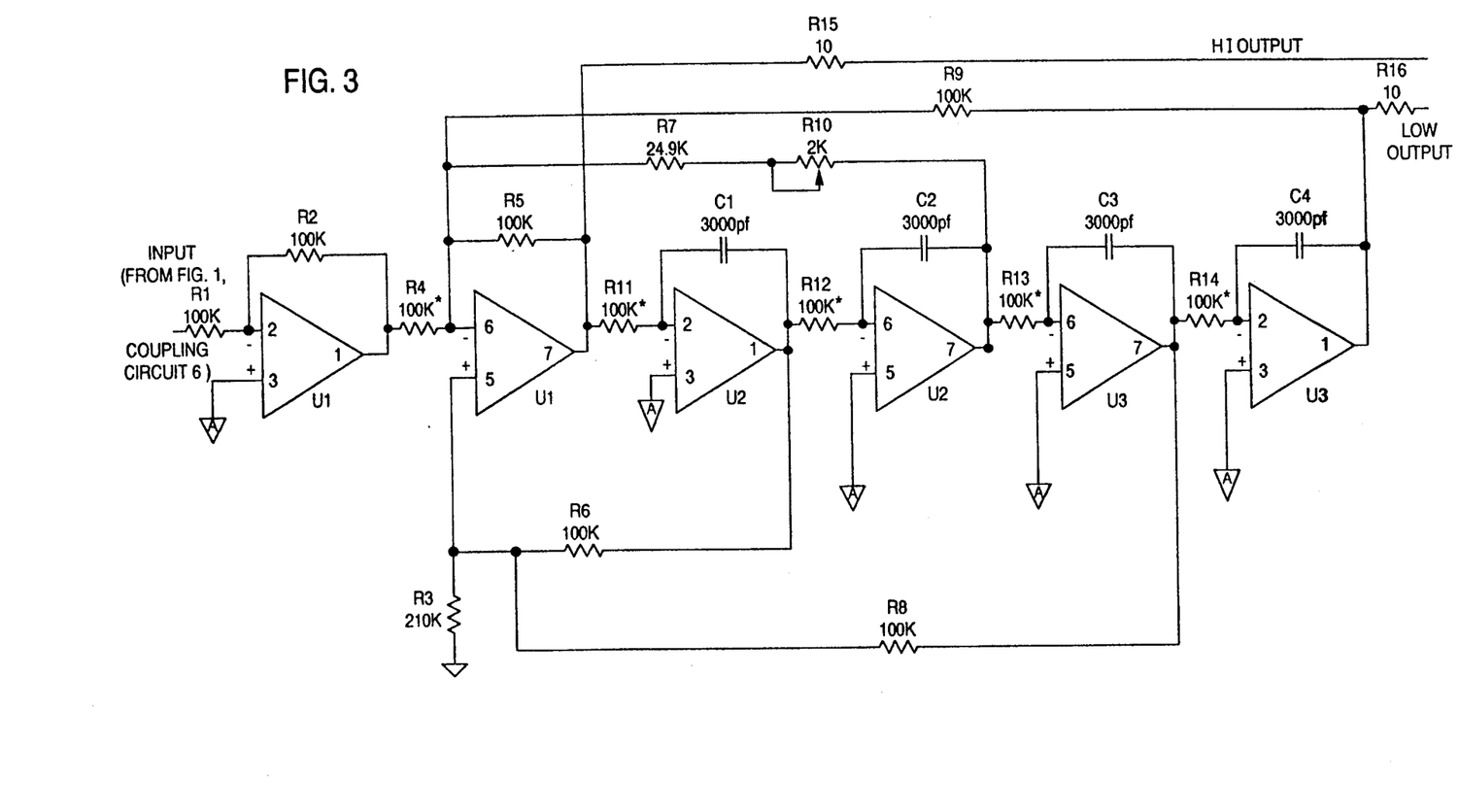
FIG. 3 is a detailed schematic diagram of an exemplary electronic crossover network circuit for application as electronic crossover networks 1-L of FIG. 1.

Referring now to FIG. 3, the electronic crossover network module of the present invention is a fourth order constant voltage crossover design. The module provides both low-pass and high-pass outputs. The slope of both outputs is 24 dB/octave. Because of the fourth order design, the high-pass and low-pass functions simultaneously guarantee a near perfect match of the high-pass and low-pass responses. One crossover network is needed for each coupled channel of a bi-amplified system, the crossover networks separating the amplifier stages from one another. A tri-amplified system requires two networks, one to separate the low and mid frequencies. A quad system needs three networks, and so on. Two active filters providing two channels of low frequency outputs can also be used to drive a subwoofer, where the subwoofer is shared by the combined two channels of the stereo system.

The crossover frequency of one electronic crossover network can easily be changed by changing the value of four resistors. These four resistors R11-R14 may be mounted on an 8 pin DIP type header plug for ease of change. The four resistors of each crossover network are selected for the frequency of interest. They should be 280 kilo ohm resistors for 150 Hz, 15 Kilo ohm resistors for 6 Khz, 8 kilo ohm resistors for 20 khz, 5.5 kilo ohms for 30 Khz and so on depending on the design criteria applied and provided capacitive values are set at 3000 picafarads. A trimmer potentiometer R10 of the circuit allows for adjustment of the frequency response at the cross-over frequency. A boost of up to 2 dB at the cross over frequency compensates for a dip in the response at the cross-over frequency found in some systems.

The crossover should comprise high grade components to assure predicted results: 1% metal film resistors, 1% polystyrene film capacitors for the depicted capacitors and three dual FET input operational amplifiers. Providing connectors for input, output and power may facilitate assembly.

TABLE 1

| Frequency response: | DC to 100 KHz. +/−10.2 dB |
|---|---|
| Cross over frequency: | 1 Hz-200 KHz (selectable) |
| Insertion gain: | 0dB (1x). |
| Filterscope: | 24 dB/octave |
| Output load capability: | 2K min. |
| Input impedance: | 100K |
| Output impedance: | 10 Ohm, typ. |
| Maximum Input voltage: | 25 V p-p (8.8 v RMS). |
| Power supply requirement: | +15 V and −15 V @ 15 mA. typ. |

The crossover network implements a fourth order constant voltage active low-pass and high-pass filter. The filter has a square-butterworth transfer function, the same as two second order butterworth filters connected in series. Input and output buffer amplifiers are also provided. The complex frequency transfer functions of the high-pass and low-pass filters are given by:

$$HP(s) = \frac{s^4}{(W_c^2 = 1.414^* W_c^* s + s^2)^2}$$

$Wc = j^*2^*pi^*Fc$.
$Fc$ = crossover frequency
$s = j^*2^*pi^*F$
$F$ = frequency in Hz $$LP(s) = \frac{1}{(Wc^2 + 1.414^* Wc^* s + s^2)^2}$$

$Wc = j^*2^*pi^*Fx$.
$Fc$ = crossover frequency
$s = j^*2^*pi^*F$

Also, the amplitudes of the transfer functions are given by:

$$HP(F) = \frac{1}{1 + (Fc/F)^4} \quad LP(F) = \frac{1}{1 + (F/Fc)^4}$$

These characteristics represent a sharp 24 dB/octave attenuation slope in the stopbands.

It follows that: HP(F) +LP(F) =1; consequently, the sum of the high-pass and low-pass output signal of the filter is thus equal to the input signal. Also, the two output signals are always in phase. Consequently, the output sound waves of the loudspeakers at the cross-over frequency add in phase. However, at the crossover frequency, the total power equals to half the power far removed from the crossover point:

$P(F)=H(F)^2$, $Ptot=Plp+Php$

At the crossover frequency:

$Ptot(Fc)=\frac{1}{4}+\frac{1}{4}=\frac{1}{2}$.

In some cases the total sound pressure at the cross-over frequency will show a dip, because the sum of the output power of the loudspeaker is not unity. As already described, the crossover comprises the potentiometer R10 that permits adjustment of the frequency response at the crossover point. At full adjustment, a 2dB peaking is realized. The phase function is the same for all three transfer functions, high pass, low pass and sum.

No amplification ideally should be provided by the electronic active crossover network so as to not amplify intermodulation distortion noise created in the preamplifier. Consequently, the present active network achieves unity gain.

Some typical arrangements for 2-way, 3-way and 4-way installations are described below. Two crossover networks (crossover networks 1 and 2 of FIG. 1) may be used to drive a common subwoofer by adding left and right loudspeaker outputs together at signal combining circuit 8 (FIG. 1). A simple resistive network or a more complex summing amplifier may be utilized for combining the signals. In particular, 2.2 K ohm resistors may be provided at each crossover network output and coupled together to the input of an output amplifier according to FIG. 4 via a value for $C_1$ of 2.2-4 uf and a value for $R_1$ of 10-50 Kohms.

In other words, left and right channel input signals of a stereophonic system may be separately treated via the first and second electronic crossover networks 7, one for each channel. Furthermore, referring to FIG. 1, the low frequency output band L of 17.5-150 Hz is utilized from each and summed at signal combining circuit 8 and provided to an output amplifier 9 for amplifying only the 17.5-150 Hz band. Thereafter, the 17.5-150 Hz band output of output amplifier 9 is provided to a subwoofer loudspeaker assembly 10 substantially in accordance with FIG. 5. The left and right channel higher frequency outputs H of these same electronic crossover networks 1 and 2 at 150-6 KHz are provided via signal combining circuit 8 to first and second output amplifiers 9 of FIG. 1. The left and right channel outputs at 150-6 KHz are in turn provided to two midrange speaker assemblies substantially in accordance with FIG. 6.

As already briefly described, the crossover network is implemented with a fourth order active filter. The filter and the two buffer amplifiers are implemented via the Bi-FET op-amp's U1, U2, and U3. These comprise preferably either LM351 or LF353 N integrated circuits of National Semiconductor Corporation. One advantage of this type of active filter is that it provides simultaneous and in phase high-pass H and low-pass L output functions at each of the two ends of the series chain of four integrators. This means that only four precision capacitors C1-C4 are required of 3000 pf each to implement each fourth order function. Also, both high-pass and low-pass functions will be perfectly matched because they are derived from the same crossover network.

Referring again to FIG. 1, the depicted embodiment only relates to two channels of input. If four input channels of a quadraphonic sound are provided, additional crossover networks are utilized in a similar manner to that already described to provide a combined low frequency input to a subwoofer loudspeaker assembly and four midrange outputs to four midrange speakers.

In addition, in the stereophonic system according to FIG. 1 two crossover networks may be separately provided and their outputs combined for outputing a passband of 150 Hz-20 KHz to a center channel loudspeaker assembly according to FIG. 7.

Further, in the stereophonic system according to FIG. 1, two crossover networks may be separately provided and their outputs combined at signal combining circuit 8 for outputing a passband of 6 KHz-30 KHz to a tweeter loudspeaker assembly according to FIG. 8.

According to FIG. 1, actually a plurality of L such electronic crossover networks are provided, each having sharp cutoff characteristics outside the band of interest, depending upon the number of input signals provided and the number of output loudspeaker assemblies utilized.

Preferably, only the midrange loudspeaker assemblies are utilized for a plurality of input audio channels. The associated band of interest of approximately 150 Hz-6 KHz comprises the intelligible portion of sound information for differentiating, for example, a violin from a cello. An omnidirectional sound presence is preserved along with a sense of appreciation of the provided input channels.

OUTPUT POWER AMPLIFIER

Referring to FIG. 4, the output power amplifier circuit will now be described in detail. The power amplifier comprises an LM391N operational amplifier and in combination with balance circuits and a Darlington output stage provides a module which will deliver a clean, low distortion watt of power to any 8 Ohm loudspeaker. The amplifier is rated to drive reactive loads with a phase angle of up to 45 degree at full output voltage. The amplifier can take its input from any preamp, electronic crossover or other source. The circuit makes use of the integrated circuit driver chip supplied by National Semiconductor and two complimentary Darlington power transistors. The compact design fits on a small circuit board that may be mounted directly on a heavy-duty heatsink for the Darlington out-put transistors.

The available output power depends on the voltage and current rating of the power supply and the impedance of the load (8 Ohm or 4 Ohm).

The amplifier can be operated in a class A mode as well as a 1 watt mode. In this mode the module can deliver 10 Watts RMS continuous into an 8 Ohm load, when using a + or −18 VDC power supply.

The amplifier module is protected with an output current amplifier which may be limited to a safe value, so that the amplifier cannot be damaged by short circuits at the output. In the event of overheating, the amplifier will turn itself off until it cools down again as it is provided with a temperature sensor input signal.

TABLE 2

| | |
|---|---|
| Frequency response: | 5 Hz-50 KHz, +/−1 dB; |
| Total Harmonic Distortion: | less than 0.1% @ 1 Khz.; |
| Voltage gain: | 20 dB (10x); |
| Input impedance: | 100 KOhm, AC coupled. |
| Output load: | 4 or 8 Ohm, DC coupled. |
| Max power output with +/−18 V Power Supply: | 10 Watt RMS, continuous, into 8 Ohm. (class A) |
| Max power output with +/−30 V Power Supply | 50 Watt RMS, continuous, into 8 Ohm. (class B) |
| Power supply range | +/−150 V to +/−45 V, dual supply |
| Absolute Maximum | +/−50 Volt (may be unregulated) |

TABLE 2-continued

Power Supply Voltage

The power amplifier module achieves high performance and low parts count by using the LM391 audio power driver amplifier circuit from National Semiconductor Corporation. This integrated circuit can directly drive the two output Darlington power transistors Q1 and Q2. The circuit has output current limiting and Safe Operating Area (SOA) protection for the power transistors. The amplifier also has a turn on delay circuit set by R-C network R2, C2 that minimizes the output transients when the amplifier is turned on. A temperature sensor, mounted on a heatsink of the power transistors, protects the circuit by turning the amplifier off when the temperature exceeds 65 degrees Centigrade. It is rated at 50/Watt RMS continuous operation with an 8 Ohm load depending on the power supply voltage.

The circuit diagram for the amplifier is particularly shown in FIG. 4. All component values are exemplary for the present design and are intended to be illustrative only of the principles of the present invention which may be readily adapted by one of skill in the art. The complimentary output power Darlington transistors Q1 and Q2 are driven directly by IC1, the LM391 audio power driver circuit.

The output stage operates in a standard class AB configuration. The bias current of the output stage is set with R8. The output current limit and SOA protection is set with R6, R7, R10-R19 and D1, D2. The Darlington transistor $Q_1$ circuit including resistors R14, R16 R18, and so on is balanced by the $Q_2$ transistor circuit comprising resistors R15, R17, and R19 for noise reduction and balanced operation. The dual slope current limit allows the current limit set point of the output transistor to vary with the collector voltage of the transistor. For low collector voltage, a high collector current is allowed, but as the collector voltage increases, the allowable current is reduced. At first the current is limited by the allowed power dissipation of the device, but as the collector voltage increases over a certain value the maximum current is reduced in order to avoid secondary breakdown of the transistors. This secondary breakdown is a major factor in limiting maximum output power in an amplifier; it is caused by hot spots that occur in bipolar transistors at the higher power and voltage levels. The manufacturers of power transistors normally specify a Safe Operating Area for the transistor that avoids these pitfalls. The present transistors comprise SN 6284 and SN 6287 transistors and the SOA and current limits are imposed by the transistor manufacturer. The output load line for an inductive kickback are controlled by the free-wheeling diodes D3 and D4. Inductor L1, capacitor C10 and resistors R20 and R21 insure the stability of the amplifier. The amplifier operates as a standard operational amplifier in a noninverting mode. The gain is set to a value of 20 dB (voltage gain of 10 dB) with resistors R4 and R5. The input signal is coupled to the integrated circuit from an input connector via C1 and R1. This capacitive coupling has a corner frequency of 1.6 Herz and insures minimal phase distortion at the low frequencies of the audio spectrum.

Resistor R2 and capacitor C2 provide for a turn-on delay of about 1 second. The turn-off feature of the LM391 is operated by sinking current from pin 14. When the current exceeds about 1mA, the internal circuit will kill the drive to the output transistors. This input is also used to activate the thermal protection of the amplifier. The temperature sensor R3 is a temperature dependent resistor. When cold it has a resistance of about a 1 megaohm, but when it is heated the resistance will suddenly drop to a value of about 100 KOhm at 62 degrees C. This will activate the turn-off circuit of IC1. The heatsink will now cool off because of the elimination of the power dissipation of the output transistors. When the temperature gets down to 70 degrees, resistor R3 will switch back to a high value, and the amplifier will turn back on.

In the interest of low distortion and high stability, metal film resistors are used for all low power resistors. No electrolytic capacitors are used in the signal path. The capacitor C1, and transistors Q1 and Q2 are mounted in sockets and connectors provided for input, output and power facilitate maintenance.

An unregulated power supply portion of power supply 21 of FIG. 1 may be used for powering the output amplifier at varying voltage depending on design and is described (but not shown) below. A transformer with a center tapped secondary and series connected dual complementary rectifier circuit may provide unregulated DC power to the amplifier. A filter capacitor connected to rectifier output stores the DC energy during the peaks of the AC cycle and delivers the output current between the peaks. A large capacitance is needed for achieving a low ripple voltage. Bleeder resistors of 10 kilo ohms allow the capacitors to discharge in a reasonable time after the supply is turned off.

The following formula may be used for determining the transformer secondary voltage:

$$Vac = 0.7 * (Vout + Vripple + Vrect)$$

Vac = voltage of half of secondary (Volt)
Vripple = p-p ripple voltage (Volt) 2 V pp, typical)
Vrect = rectifier voltage drop. (Volt) (1 V typical)

An output voltage of 30 Volts thus requires a transformer with dual secondary of Vac = 23.1 Volt RMS. A transformer with a dual 24 V secondary, or a 48 V center tapped secondary may be an appropriate choice and will provide a voltage of 32 V. The current rating of the transformer may be obtained with the following formula:

$$Idc = 0.35 * (Vdc - Vdrop)/Rload$$

$$Iac = 1.2 * Idc$$

Idc = DC power supply current (AMP)
Iac = transformer current (AMP)
Vdc = Supply Voltage (Volt)
Vdrop = amplifier dropout.voltage (Volt)
Rload = load resistance (Ohm)

The dropout voltage is the difference between the power supply voltage and the output at full output voltage. It is at least 3 Volt. For a 32 Volt supply and 8 Ohm load the transformer has to be rated at 1.3 amp at least. This means the transformer must have a Volt-Ampere rating of at least 65 VA.

The value of the filter capacitor can be estimated from the formula for the ripple:

$$Ipeak = (Vdc - Vdrop)/Rload$$

$$C = Ipeak/(3 * Fac * Vripple)$$

Ipeak = peak DC current (Amp)
C = capacitance (Farad)
Vdc = Supply voltage (Volt)
Vdrop = amplifier dropout voltage (Volt)
Fac = line frequency (Herz)
Vripple = p-p ripple voltage (Volt)
Rload = load resistance (Ohm)

With a line frequency of 60 Hz the power supply thus needs a filter capacitor of 0.01 Farad, or 10.000 uF. The rectifier diodes should be rated at at least Ipeak = 3.6 Amp and twice the peak to peak Ac voltage of $(48 \times 1.42) = 68$ Volt.

For powering multiple output amplifiers 9 from a single supply the ratings and values should be multiplied accordingly. A supply voltage of +/-32 Volt will give an output power of 50W into 8 Ohm. A higher power supply voltage will yield a higher output power. It is very important that the power supply voltage should never exceed the absolute maximum rating of +/-45 volt. The maximum RMS power the amplifier delivers into a resistive load is given by:

$$Vmax = Vps - Vdrop$$

$$Pmax = (Vmax)^2/(2 * Rload)$$

Pmax = maximum delivered power(Watt)
Vmax = peak output voltage(Volt)
Rload = load resistance(Ohm)
Vps = power supply voltage(Volt)
Vdrop = amp.dropout voltage(Volt)
(assuming the output current limit is not exceeded).

Thus, with a supply voltage of 45 Volt, a load of 8 Ohm and a typical minimum voltage drop between power supply and output of Vdrop = 5 Volt, the maximum output power is 100 Watt.

The reason that the power output amplifier is rated at only half this power is that the heatsinks are not big enough to allow sufficient cooling for continuous duty at this power.

(*A + 1-50 can be used with LM391-100-110-125 Watts.)

Also, the typical load is not a pure resistor. As can be seen in FIG. 1 and FIG. 2, the current to voltage relationship of a typical reactive load causes higher currents at lower output voltages, and this causes the output current limit to be activated sooner than expected.

The output amplifier of FIG. 4 can also be operated in class A mode if so desired. In this mode the amplifier can deliver 10 Watt RMS into an 8 Ohm load. In class A mode the bias current of the output stage should be adjusted to be 0.9 Amp. The voltage between emitters of Q1 and Q2 is adjusted to 0.9 Volt. The amplifier should be operated with a power supply of +/-18 to 20 Volt DC, rated at 1.5 Amp. A regulated supply of +/-18 VDC or an unregulated supply may be used, but with a transformer with a secondary of 30 to 36 VTC @2A.

In class A mode the amplifier will dissipate power regardless of driving a load. This means that the amplifier will become quite warm, and special attention should be given to proper cooling of the heatsink.

While the present output amplifier is capable of operation at a different class depending on applied voltage, class AB operation at + or -40 VDC is chosen to provide maximum power and to avoid the + or −45 VDC limit.

SUBWOOFER LOUDSPEAKER ASSEMBLY

Referring now to FIG. 5, a subwoofer loudspeaker assembly comprises an enclosure for three loadspeakers having four separate chambers. The three loadspeakers are located in a control chamber, two of which loudspeakers are directed outward and are each mounted on a four sided flat planar surface wall having the dimensions of 7", 28", and 13" on three of its four sides. The third loudspeaker is directed down into the lowest chamber. The chamber containing the loudspeakers is ported to a chamber immediately above. This chamber is separated from the uppermost chamber by a port containing a vibration-isolated tube 4" in diameter and 6" long. The uppermost chamber is also ported to the exterior of the enclosure by an aperture. Extending inwardly from the aperture is a 3" diameter tube which is 2" long.

The front waves from the two outwardly directed loudspeakers are directed towards the corner of a room. Facing the interior of a room is a reflective wedge-shaped or curvilinear-surface. The intention of providing such a surface is to assist traveling waves up the enclosure, to reflect undesired waves into the chamber where they may be dissipated and, in the top chamber, to reflect waves exteriorly through the aperture in the enclosure wall. The back wave created in the loudspeaker chamber is filtered through a fourth order filter and accelerated by the tube so that it departs the upper chamber toward the wall at the same time and so be approximately in phase with the front wave. Further details of the construction and operation of the subwoofer loudspeaker assembly are provided in U.S. application Ser. No. 294,365, incorporated herein by reference.

Suffice it to say, however, that the present design alleviates vibration and intermodulation distortion, is limited by the electronic amplifier circuit to passing a limited band of frequencies from 17.5 Hz–150 Hz and provides an omnidirectional sound.

MIDRANGE LOUDSPEAKER ASSEMBLY

Figure 6A:
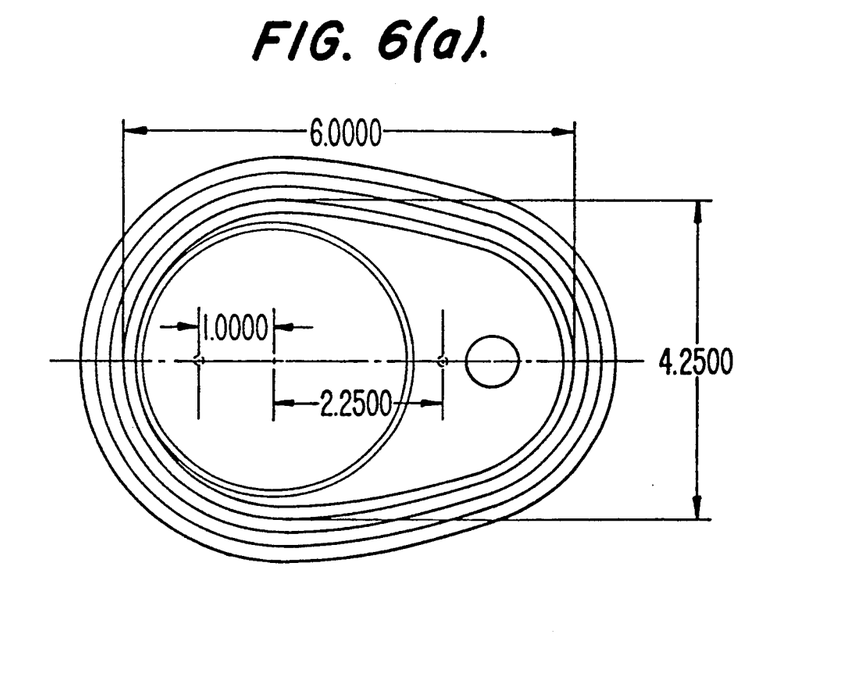
FIGS. 6a-6b are an assembly drawing in cross-section of a midrange loudspeaker assembly for broadcasting acoustic energy at a midrange of audio frequencies.

Referring now to FIG. 6, there is shown a midrange loudspeaker assembly according to the present invention. Referring first to FIG. 6($a$), the top view cross-section shows its construction from a first cylinder having an appropriate diameter for mounting either a $3\frac{1}{2}$ or a $4\frac{1}{2}$ loudspeaker. The first cylinder is located within a casing having the shape of a metal container normally employed for canning hams. However, all components of the present loudspeaker assembly except the loudspeaker and a tympanic membrane comprise moldable form plastic that is sound dead.

Also, a pipe cylinder is mounted within the container and supports an upper chamber including a tympanic membrane of polypropylene and a sound diffusion cone. The pipe cylinder comprises an acceleration straight portion and a Venturi flared portion.

Figure 6B:
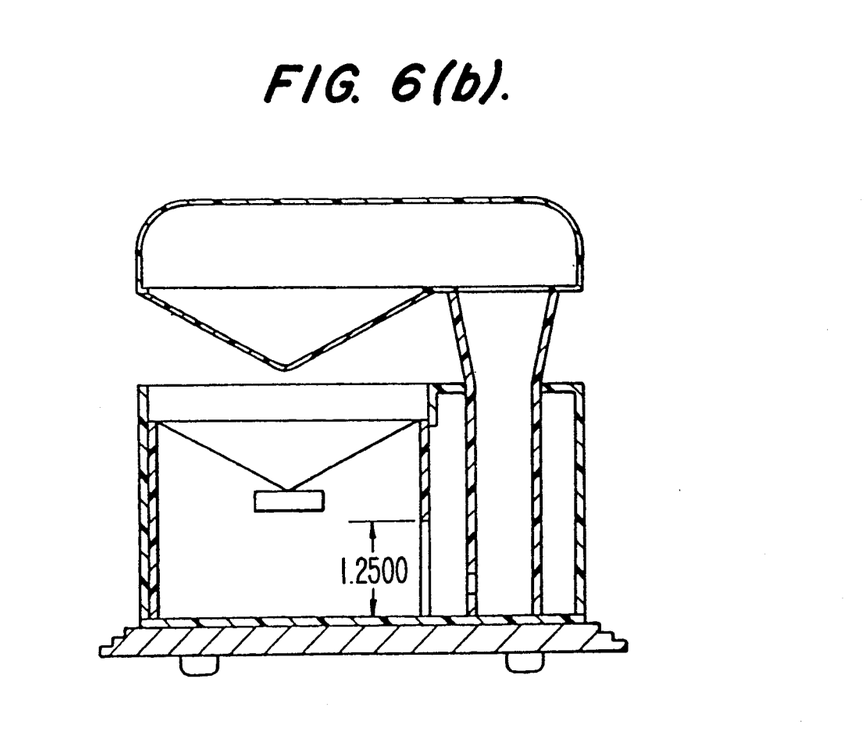

Referring now to FIG. 6($b$), a port connects the first cylinder to a second chamber defined by the volume not taken by the speaker cylinder or the pipe cylinder within the outer container. The port is shaped as an isosceles triangle of a height of 1.25" and a base of 1.15". The port filters the back wave off the loudspeaker into the second chamber.

A second rectangular port of a size $\frac{1}{2}$" wide by $\frac{1}{4}$" high in the wall of the pipe cylinder further filters the back wave.

The backwave of limited backwidth is accelerated up the tube through the Venturi flared portion into the upper chamber. The back wave then is broadcast via the tympanic membrane and, also, provides a vibration canceling effect at the diffusion cone.

Further details of the construction and operation of the midrange loudspeaker assembly of FIG. 6 are provided in U.S. application Ser. No. 294,364, incorporated herein by reference. Suffice it to say, however, that the present design alleviates vibration and intermodulation distortion, is limited by the electronic amplifier circuit to passing a limited bandwidth of frequencies from 150 Hz to 6 KHz and provides an omnidirectional sound.

Two midrange loudspeaker assemblies are provided in the present system for broadcasting left and right stereophonic sound channels. Additional midrange assemblies may be provided for quadraphonic sound. Also an additional midrange loudspeaker assembly may be provided for a time delayed, combined stereophonic sound channel to create a concert hall effect.

CENTER CHANNEL LOUDSPEAKER ASSEMBLY

The center channel loudspeaker assembly of the present invention is similar to the midrange loudspeaker assembly shown in cross-section in FIG. 6($a$). It does not comprise a pipe cylinder or upper chamber section including a tympanic membrane or diffusion cone as may be seen from the side view of FIG. 7. On the other hand, the center channel loudspeaker assembly comprises the same isosceles triangle part joining a first and a second chamber. The two chambers form a second order filter whose purpose is explained below.

Two coaxially mounted acoustic energy loudspeakers, for example, the model AM10P19BSM woofer and the Model TW 22 tweeter manufactured by Audax, broadcast energy across a band extending from 150 Hz to 20 KHz, the tweeter being surrounded by the woofer and above the woofer. A directional dome shown in FIG. 7 is rotatable and may direct and smooth the broadcast front wave from the woofer and tweeter to, for example, a television screen if desired. On the other hand, the hemi-dome may be removed for omnidirectional sound broadcast.

A backwave is transmitted primarily by the woofer into the chamber of the first cylinder. Via the port between the first and second chambers, the once filtered backwave is passed to the second chamber. The second chamber is intentionally filled with a fibrous sound-absorbing material such as Hollowfill material. The second chamber being turned to high frequency, the high frequency back wave energy is intentionally absorbed within the sound-absorbing material. In this manner, the tweeter is permitted to broadcast high frequency acoustic energy while the woofer output of high frequency energy is absorbed and attenuated. Consequently, acoustic intermodulation products caused between the two coaxially mounted loudspeaker is minimized.

Furthermore, the Audax coaxially, mounted speakers include a passive crossover network for the tweeter loudspeaker which intentionally prevents lower frequency electrical signals from reaching the tweeter loudspeaker. The net result then is not necessarily to create a perfectly non-overlapping band of interest for each type of loudspeaker but to at least minimize the creation of intermodulation distortion to the greatest extent possible in the design of the center channel loudspeaker assembly according to the present invention.

In other words, the frequency band of interest of the tweeter is intentionally defined in a known manner by the provision of a passive crossover network. The frequency band of interest of the coaxially mounted woofer is intentionally acoustically limited to lower frequencies by the second order filter constructed of the first and second ported chambers, the second chamber being filled with sound absorbing material.

An additional center channel loudspeaker assembly may be provided for broadcasting a time delayed, combined stereophonic sound channel to create a concert hall effect.

TWEETER LOUDSPEAKER ASSEMBLY

Referring to FIG. 8, a tweeter loudspeaker assembly comprises a cylinder whose top surface comprises four concentric annular rings surrounding a single domed tweeter loudspeaker. Thus, the two elements of this device comprise a domed tweeter loudspeaker or high frequency transducer for delivery of high frequency sound to a listener and a lens with concentric annular rings radiating out from the center dome of the tweeter. This lens is used to direct the very high frequencies out to a listener who may be at different locations in the listening room.

The domed tweeter is required comprising a hemispherical shaped diaphragm of reasonable quality, preferably an Audax titanium dome tweeter. The tweeter has a frequency response characteristic that allows for a smooth driven range of high frequency energy at the more critical regions of the frequency spectrum, i.e., 10 KHz to 20 KHz. The Audax tweeter thus described has an increase in gain in the frequency band of 10 KHz to 20 KHz and so matches a high frequency attenuation characteristic exhibited by the annular rings.

Another consideration for this tweeter was its size and power handling capacities. The size called for a one inch dome tweeter which would permit the very peak of the dome to be extended approximately 0.188" above the first annular ring and therefore all subsequent rings.

The lens section of the tweeter comprises the horizontal planar surface of the mounting assembly. This assembly is made of a low resonance material such as an ABS foam plastic which aids in the resolution of resonance particles which have a tendency to color the sound. The lens comprises four annular rings which protrude upward having semicircular cross section on a flat horizontal surface with spaces in between.

As mentioned earlier, the tweeter loudspeaker exhibits an elevated frequency response at 10 KHz to 20 KHz. The coupling of this lens and tweeter combination thus provides an acoustically smooth frequency characteristic.

The semicircular or cross section in rings with flat spaces in between was discovered to be important by testing. The dimensions of the spaces and rings relate to the wavelengths of dispersed sound.

Standing waves along the surface of the annular rings result in some high frequency waves being trapped between the hemispheres and are reflected against other waves of like frequency and phase. Once the direct wave intermingles with the reflected wave, it is then out of phase and cancels those waves or components thereof. This effect allows for a smooth soft high frequency sound in a 360° horizontal plane and a 180° vertical plane.

The shape of the annular rings of semicircular cross section along with the flat grooves between the rings permits the opposite side of the ring from the tweeter, i.e., the part of the ring that is on the outer side to reflect the pressure wave or sound upward and out from the tweeter and thus the tweeter lens acts as an acoustic amplifier as well as a first order filter, again trapping some sounds while redirecting others upward and outward.

More particular detail of the tweeter loudspeaker assembly is provided in U.S. application Ser. No. 294,366, concurrently filed herewith and incorporated herein by reference.

AMPLIFIER CASING

Figure 9A:
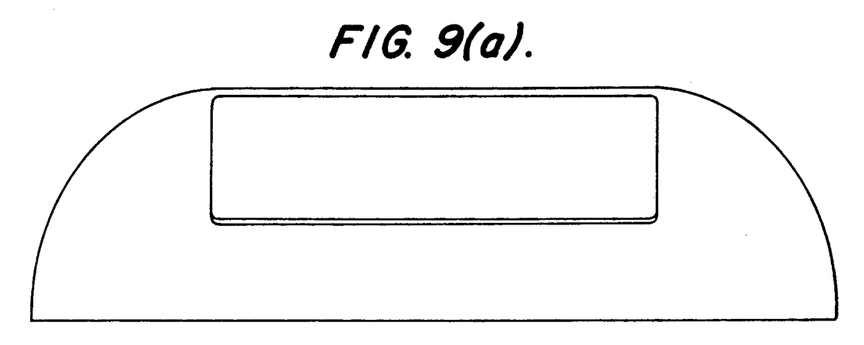
FIGS. 9a-9b are a perspective view of a housing for enclosing the amplifier system portion of FIG. 1, the housing having an ornamental design which melds integrally with the ornamental designs of coupled loudspeakers according to FIGS. 5-8.
Figure 9B:
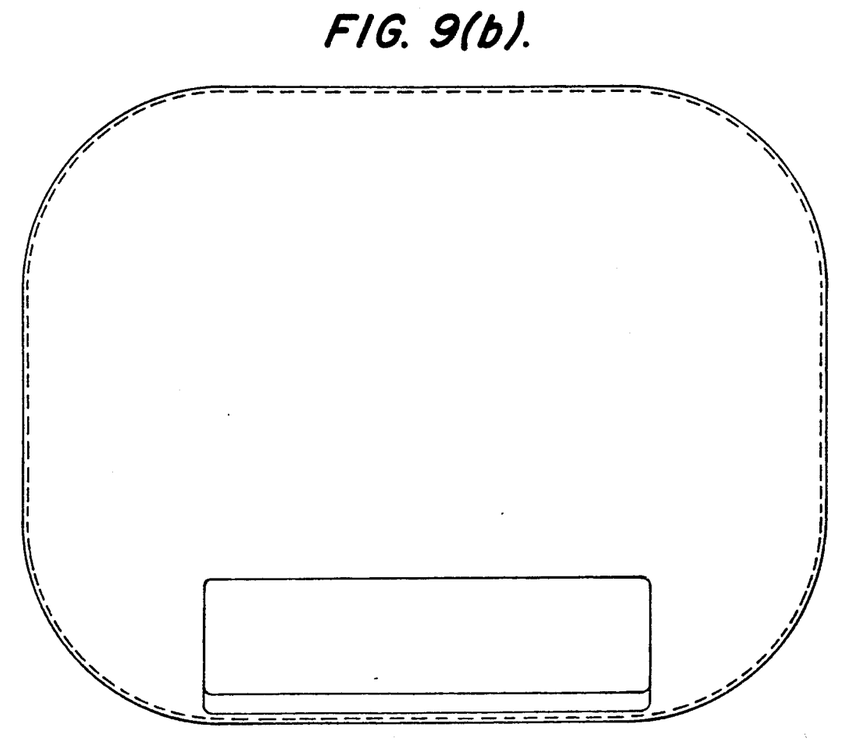

Referring now to FIG. 9, an ornamental design of an amplifier housing is shown which combines well with the ornamental effect created by the loudspeaker assembly designs of FIGS. 5-8. This housing shares the same curvilinear modern appearance with a similar appearance created by the ornamental designs of the loudspeaker assemblies.

The amplifier casing encloses all plug-in modules of the system electronics such as the output amplifier module. The display portion further comprises an infrared or other control signal receiver for receiving signals from a remote control keypad.

We claim:

1. An electronic audio signal amplifier and loudspeaker system comprising:
   a preamplifier circuit for amplifying an input signal in the audible frequency range;
   a plurality of L electronic crossover networks coupled to the preamplifier circuit for conjugating the input signal into output signals of predetermined bands of frequencies, L being greater than or equal to two, at least two electronic crossover networks each having a high pass and a low pass frequency function;
   a plurality of M output amplifiers coupled to the L electronic crossover networks for providing an additional stage of amplification to the input signal, M being greater than L;
   a signal combining circuit for coupling output signals of the L electronic crossover networks to the M output amplifiers; and
   a plurality of M loudspeaker assemblies, each loudspeaker associated with one output amplifier, at least three of the loudspeaker assemblies for broadcasting a conjugated, non-overlapping band of frequencies within the audible frequency range.

2. A system according to claim 1 for stereophonic sound reproduction,
   the preamplifier circuit particular comprising two preamplifiers for amplifying signals of left and right stereophonic channels,
   the number of electronic crossover networks being greater than or equal to three, and
   the number of output amplifiers and loudspeaker assemblies being greater than or equal to four.

3. A system according to claim 1, each electronic crossover network comprising an active filter with a sharp cut-off characteristic outside its conjugated band of frequencies.

4. A system according to claim 1, each electronic crossover network particularly comprising a fourth order active filter of four series-connected operational amplifiers.

5. A system according to claim 1,
each output amplifier comprising an operational amplifier for driving a balanced pair of Darlington power transistors.

6. A system according to claim 5,
each output amplifier adapted to operate at Class A, Class B, or Class AB depending on the level of applied power.

7. A system according to claim 1,
the loudspeaker assemblies comprising
a subwoofer loudspeaker assembly,
two midrange loudspeaker assemblies,
a center channel loudspeaker assembly and
a tweeter loudspeaker assembly, the two midrange loudspeaker assemblies for broadcasting left and right stereophonic channels.

8. A system according to claim 1,
the loudspeaker assemblies further comprising a loudspeaker assembly for broadcasting a time-delayed combined stereophonic sound channel to create a concert hall effect.

9. A system according to claim 1 further comprising
a control circuit for controlling the system having three modes of control,
the control circuit being coupled to all output amplifiers for providing a gain control,
the control circuit being coupled to certain output amplifiers for providing a balance control and
the control circuit being coupled to a switching array for controlling the connection of an input signal to the preamplifier circuit.

10. A system according to claim 9, the switching array further comprising means for simultaneously connecting at least two inputs to two outputs, one of which outputs being connected to the input of the preamplifier circuit.

11. A system according to claim 10, the switching array having means for switching six inputs to four outputs, one of which outputs being a monitor output for switchably monitoring either of the two simultaneously connected inputs and outputs.

12. A system according to claim 1 the signal combining circuit particularly comprising signal combining means for combining output signals of at least two electronic crossover networks.

13. A system according to claim 12 the signal combining means comprising at least one summation amplifier.

14. A system according to claim 12

* * * * *